(12) United States Patent
Langhammer

(10) Patent No.: US 9,613,232 B1
(45) Date of Patent: Apr. 4, 2017

(54) DIGITAL SIGNAL PROCESSING BLOCKS WITH EMBEDDED ARITHMETIC CIRCUITS

(71) Applicant: Altera Corporation, San Jose, CA (US)

(72) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/880,633

(22) Filed: Oct. 12, 2015

Related U.S. Application Data

(63) Continuation of application No. 13/752,661, filed on Jan. 29, 2013, now Pat. No. 9,207,908.

(51) Int. Cl.
*G06F 7/44* (2006.01)
*G06G 7/16* (2006.01)
*G06G 7/14* (2006.01)

(52) U.S. Cl.
CPC ............. *G06G 7/16* (2013.01); *G06F 7/44* (2013.01); *G06G 7/14* (2013.01)

(58) Field of Classification Search
None
See application file for complete search history.

(56) References Cited

U.S. PATENT DOCUMENTS

| | | | |
|---|---|---|---|
| 7,567,997 | B2 | 7/2009 | Simkins et al. |
| 8,266,198 | B2 | 9/2012 | Lee et al. |
| 8,266,199 | B2 | 9/2012 | Langhammer et al. |
| 8,301,681 | B1 | 10/2012 | Lee et al. |
| 8,307,023 | B1 | 11/2012 | Leung et al. |
| 2012/0290819 | A1 | 11/2012 | Langhammer |

*Primary Examiner* — Michael D Yaary
(74) *Attorney, Agent, or Firm* — Jason Tsai

(57) ABSTRACT

A specialized processing block on an integrated circuit includes a first and second arithmetic operator stage, an output coupled to another specialized processing block, and configurable interconnect circuitry which may be configured to route signals throughout the specialized processing block, including in and out of the first and second arithmetic operator stages. The configurable interconnect circuitry may further include multiplexer circuitry to route selected signals. The output of the specialized processing block that is coupled to another specialized processing block together with the configurable interconnect circuitry reduces the need to use resources outside the specialized processing block when implementing mathematical functions that require the use of more than one specialized processing block. An example for such mathematical functions include the implementation of vector (dot product) operations, FIR filters, or sum-of-product operations.

20 Claims, 10 Drawing Sheets

DIGITAL SIGNAL PROCESSING BLOCKS WITH EMBEDDED ARITHMETIC CIRCUITS

This application claims the benefit of and claims priority to U.S. patent application Ser. No. 13/752,661, filed Jan. 29, 2013, which is hereby incorporated by reference herein in its entirety.

BACKGROUND

This invention relates to integrated circuits and, more particularly, to a specialized processing block in an integrated circuit.

Consider a configurable device such as a programmable logic device (PLD) as one example of an integrated circuit. As applications for which configurable devices are used increase in complexity, it has become more common to include specialized processing blocks in configurable devices. Such specialized processing blocks may include a concentration of circuitry that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as first-in first-out (FIFO)/last-in first-out (LIFO)/serial-in parallel-out (SIPO)/random-access memory (RAM)/read-only memory (ROM)/content-addressable memory (CAM) blocks and register files), AND/NAND/OR/NOR arrays, etc., or combinations thereof.

SUMMARY

In accordance with embodiments of the present invention, specialized processing blocks on an integrated circuit may include first and second arithmetic operator stages, an output coupled to another specialized processing block on the integrated circuit, and configurable interconnect circuitry which may be configured to route signals in and out of the first and second arithmetic operator stages. The configurable interconnect circuitry may further be configured to select between signals generated by the first arithmetic operator stage and signals generated by the second arithmetic operator stage and to route the selected signals to the output. The output of the specialized processing block that is coupled to another specialized processing block reduces the need to use resources outside that specialized processing block when implementing mathematical functions that require the use of more than one specialized processing block. Examples for such mathematical functions include the implementation of vector (dot product) operations, finite impulse response (FIR) filters, or sum-of-product operations.

It is appreciated that the present invention can be implemented in numerous ways, such as a process, an apparatus, a system, a device, instructions on a computer readable medium, or any desired combination of the above. Several inventive embodiments of the present invention are described below.

If desired, the above mentioned specialized processing block may include a first arithmetic operator stage that comprises a fixed-point multiplier or a floating-point multiplier. The specialized processing block may also include a second arithmetic operator stage that comprises a fixed-point adder or a floating-point adder.

The configurable interconnect circuitry may also include multiplexers that may select between the signals that enter the first and the second arithmetic operator stage.

Further features of the invention, its nature and various advantages, will be more apparent from the accompanying drawings and the following detailed description of the preferred embodiments.

DETAILED DESCRIPTION

Specialized processing blocks may include a concentration of circuitry that has been partially or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on programmable logic devices (PLDs) is a digital signal processing (DSP) block that can be used to process audio signals (as an example). Such blocks may sometimes be referred to as multiply-accumulate ("MAC") blocks, when they include structures to perform multiplication operations, sums, and/or accumulations of multiplication operations.

For example, PLDs sold by Altera Corporation, of San Jose, Calif., as part of the STRATIX® and ARRIA® families include DSP blocks, each of which includes a plurality of multipliers. Each of those DSP blocks also includes adders and registers, as well as programmable connectors (e.g., multiplexers) that allow the various components of the block to be configured in different ways.

The implementation of some applications may require more than one specialized processing block. Examples for such functions include the implementation of vector (dot product) operations or sum-of-product operations such as finite impulse response (FIR) filters, to name a few. Signals produced in a given specialized processing block and consumed in another specialized processing block may require the use of interconnect resources outside the specialized processing block. The use of such resources may not be efficient in terms of delay and power consumption. Therefore, it may be desirable to introduce direct interconnect resources between adjacent specialized processing blocks together with configurable interconnect circuitry that may route signals to and from those direct interconnect resources.

It will be obvious to one skilled in the art, that the present exemplary embodiments may be practiced without some or all of these specific details. In other instances, well-known operations have not been described in detail in order not to unnecessarily obscure the present embodiments.

Figure 1:
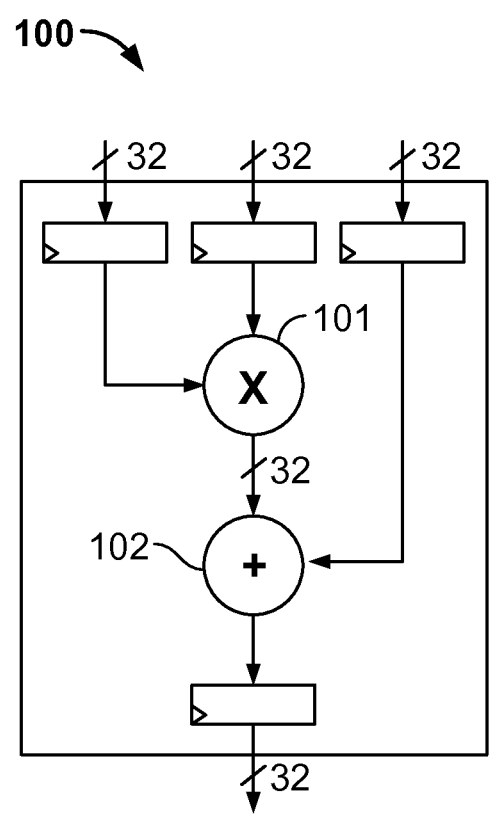
FIG. 1 is a logical diagram of an exemplary specialized processing block in accordance with an embodiment of the present invention.

An illustrative system FIG. 1 shows a logical diagram of an exemplary DSP block 100 according to an embodiment of the invention. In this logical representation, implementation details, such as registers and some programmable routing features—such as multiplexers that may allow the output of a particular structure to be routed directly out of block 100—are omitted to simplify discussion. In addition, some elements that are shown may, in an actual embodiment, be implemented more than once. For example, the multiplier 101 may actually represent two or more multipliers, as in the DSP blocks of the aforementioned STRATIX® and ARRIA® families of PLDs.

In the logical representation of FIG. 1, the adder stage 102 follows a multiplier stage 101. The multiplier stage may implement a fixed-point multiplier or a floating-point multiplier. A floating-point multiplier may be constructed from a 27×27 fixed-point multiplier and some additional logic. The additional logic may calculate exponents, as well as special and error conditions such as NAN (not-a-number), Zero and Infinity. Optionally, other logic may be provided to round the result of the multiplier to IEEE754 format. Such rounding can be implemented as part of the final adder within the multiplier structure (not shown), or in programmable logic outside the DSP block 100 when the output of the multiplier 101 is outputted directly from the DSP block 100.

The multiplier stage 101 may feed the adder stage 102 directly in a multiplier-add (MADD) mode, as depicted in FIG. 1. The adder stage may implement a fixed-point adder or a floating-point adder.

Figure 2:
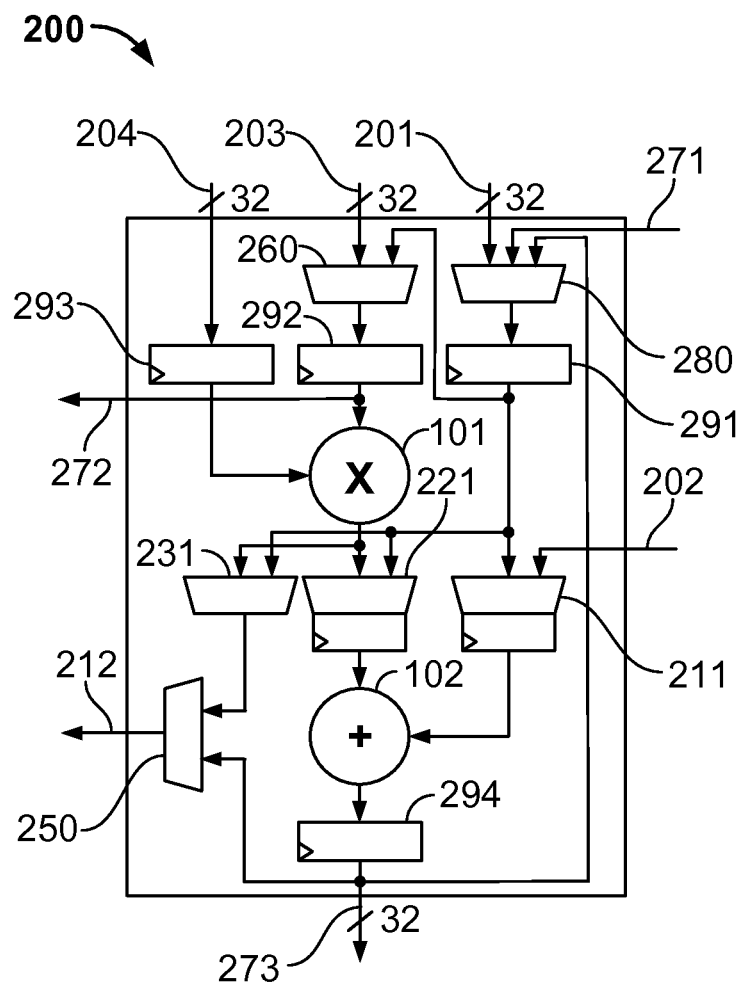
FIG. 2 is a more detailed diagram of an exemplary specialized processing block in accordance with an embodiment of the present invention.

FIG. 2 shows a more detailed diagram of an exemplary DSP block 200 according to an embodiment of this invention. DSP block 200 may have inputs 201, 203, and 204 coupled to external interconnect resources. DSP block 200 may also have inputs 202 and 271 that are directly coupled to an adjacent DSP block 200. Similarly, DSP block 200 may have output 273 coupled to external interconnect resources and outputs 272 and 212 that are directly coupled to another adjacent similar DSP block 200. Except at the ends of a chain of DSP blocks 200, there are direct connections between each input 202 and output 212 and between each input 271 and output 272.

In the example of FIG. 2, DSP block 200 handles 32-bit wide signals, such as single precision floating-point numbers as defined by standard IEEE754 (as illustrated by 32-bit wide signals at inputs 201, 203, 204, 202, and 271, and outputs 212, 272, and 273). The fact that exemplary DSP block 200 handles 32-bit signals is merely illustrative and is not intended to limit the scope of the present invention. If desired, DSP block 200 may handle any bit width. For example, DSP block 200 may handle double precision floating-point numbers (i.e., 64-bit wide signals), quadruple precision floating-point numbers (i.e., 128-bit wide signals), half precision floating-point numbers (i.e., 16-bit wide signals), to name a few.

Accordingly, the number of registers and multiplexers in DSP block 200 may be adapted to the bit width of the incoming signals. For example, in the scenario that all input signals are 32-bit wide, each register (i.e., registers 291, 292, 293, 294, and the registers feeding adder stage 102) actually comprises 32 1-bit registers. Similarly, each multiplexer (i.e., multiplexers 211, 221, 231, 250, and 260) actually comprises 32 two-to-one multiplexers, and multiplexer 280 actually comprises 32 three-to-one multiplexers. For example, each of the 32 two-to-one multiplexers that constitute multiplexer 260 may receive one bit from the signal received at input 203 and one bit from register 291. All 32 two-to-one multiplexers of multiplexer 260 may share the same control signal such that either all signals received from input 203 are selected or all signals received from register 291 are selected.

Optionally bypassable pipelining (not shown) may be provided between the multiplier stage 101 and the adder stage 102. Optionally bypassable pipelining (not shown) may also be provided within either or both of the multiplier stage 101 and the adder stage 102. Registers 291, 292, and 293 in DSP block 200 may also be optionally bypassed (not shown). A bypass path (not shown) that connects the output of the multiplier stage 101 to output 273 may be provided to enable multiplication operations that don't require additions.

DSP block 200 may have multiplexers 260 and 280 to select between inputs. Multiplexer 280 may be provided to select between input 201, input 271, and the output of the adder stage 102. Multiplexer 260 may be provided to select between input 203 and the output of multiplexer 280.

Inputs may be routed to the multiplier stage 101 from multiple sources including inputs 203 and 204 to the DSP block 200 or the output of multiplexer 280.

Inputs may be routed to the adder stage 102 from multiple sources, including the output of multiplier stage 101, the output of multiplexer 280, or input 202 from an adjacent DSP block 200.

In addition, the output of multiplier stage 101, the output of multiplexer 280, or the output of the adder stage 102 may also be routed from output 212 of an adjacent similar DSP block 200 via a direct connection to input 202 and to the adder stage in an adjacent similar DSP block 200. Specifically, multiplexer 211 may be configured to select between input 201 (or the output of multiplexer 280 or the output of register 291) and direct connection 202 as one input to adder 102. Similarly, multiplexer 221 may be provided to select either input 201 (or the output of multiplexer 280 or the output of register 291) or the output of multiplier stage 101 as another input to adder stage 102. Thus the inputs to adder stage 102 may be either the output of multiplexer 280 and the output of multiplier stage 101, or the output of multiplexer 280 and direct connection 202.

A third multiplexer 231 may be provided to select either the output of multiplexer 280 or the output of multiplier stage 101 as the output of multiplexer 231. A fourth multiplexer 250 may be provided to select either the output of multiplexer 231 or the output of adder stage 102 as the output to direct connection 212. Thus, direct connection 212 may serve to convey the output of multiplexer 280, the output of multiplier stage 101, or the output of adder stage 102.

DSP block 200 may be configured in various different ways to implement a wide variety of functions. For example, DSP block 200 may be configured to implement a shift register, a multiplier, a multiply-add function, a multiply-accumulate function, just to name a few. Consider the scenario in which DSP block 200 is used as a shift register. In this configuration, data may enter DSP block 200 at input 271 and may be stored in register 291. From there, the data may be routed through multiplexer 260 to register 292 and from there to output 272. Either the output of registers 291 or 292 may be tapped but not both at the same time. For example, the output of register 291 may be tapped by providing zero on input 204 thereby producing a zero at the output of the multiplier. Multiplexer 221 may be configured to select the multiplier output as the first input to adder stage 102. Multiplexer 211 may be selected to choose the output of register 291 as the second input to the adder stage. Routing the output of the adder stage to output 273 may provide the output of register 291 at output 273. The output of register 292 may be tapped by providing the value '1' on input 204. Multiplying the output of register 292 with '1' yields the output of register 292 at the output of the multiplier stage 101. The interconnect may be configured such that the multiplier output bypasses the adder stage thereby providing the output of register 292 to output 273.

Figure 3:
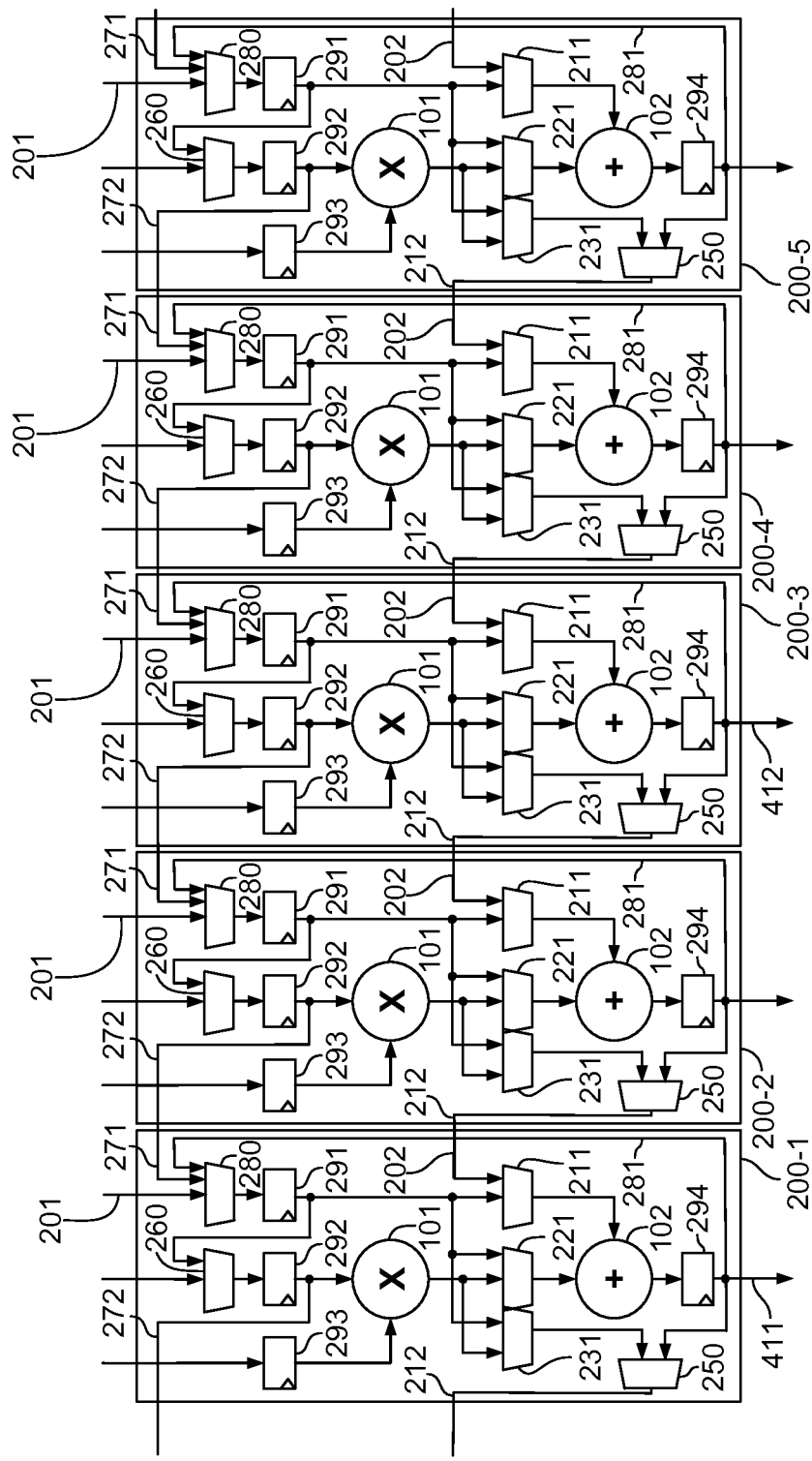
FIG. 3 is a block diagram of a number of exemplary specialized processing blocks coupled in a chain in accordance with an embodiment of the present invention.

Multiple DSP blocks according to embodiments of the invention may be arranged in a row or column, so that information can be fed from one block to the next using the aforementioned direct connections between output 212 and input 202 and between output 272 and input 271, to create more complex structures. FIG. 3 shows a number of exemplary series-connected DSP blocks 200-1, 200-2, 200-3, 200-4, and 200-5 according to an embodiment of the invention.

Figure 4:
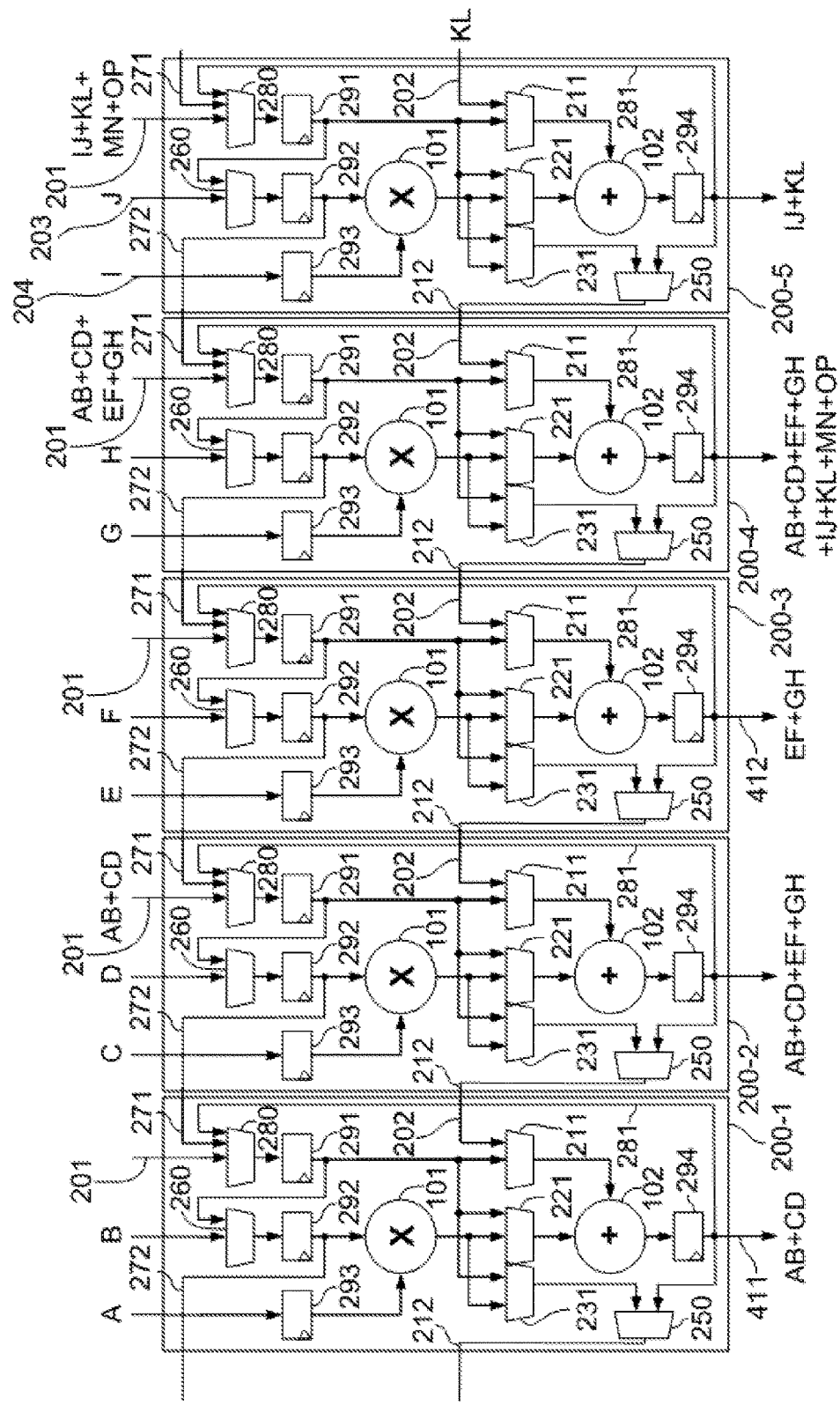
FIG. 4 is a diagram of an illustrative arrangement of specialized processing blocks that can be used to perform a vector dot product operation in accordance with an embodiment of the invention.

FIG. 4 shows a row of five DSP blocks 200-1 to 200-5 according to an embodiment of the invention configured to perform a dot product operation. Alternatively, the DSP blocks 200 in that configuration could be arranged in a column (not shown) without changing the inputs and outputs.

The two vectors to be multiplied may be X=(A, C, E, G, I, K, M, O) and Y=(B, D, F, H, J, L, N, P). Each DSP block 200-1 to 200-5 receives one element of vector X and one element of vector Y on inputs 203 and 204 (see FIG. 2) respectively. For example, DSP block 200-1 may receive A from vector X on input 204 and B from vector Y on input 203. Since there are eight elements in each of vectors X and Y, multiplication of vectors X and Y requires eight DSP blocks. Only five DSP blocks are shown in FIG. 4. The remaining three DSP blocks are omitted to simplify the discussion. They may be configured similar to DSP blocks 200-1 to 200-3 to produce together with DSP block 200-5 the partial dot product (IJ+KL+MN+OP).

In each pair of blocks 200-1/200-2 and 200-3/200-4, the multiplier 101 in each block, along with the adder 102 in the leftmost block 200-1, 200-3 of the two blocks, implement a respective sum 411, 412 of two multiplication operations. Those sums 411, 412 are added together with the rightmost adder of the leftmost pair (i.e., with adder 102 of DSP block 200-2). Sum 412 may be routed to adder 102 of DSP block 200-2 through multiplexer 250 and output 212 of DSP block 200-3 to input 202 of DSP block 200-2 and from there through multiplexer 211 to adder 102. Sum 411 may be routed from the output of DSP block 200-1 to input 201 of DSP block 200-2 (e.g., using interconnect resources outside of DSP blocks 200-1-200-4) and from there through multiplexer 221 to adder 102, which may thereby provide a sum of four multiples. The rightmost adder of the rightmost pair (e.g., adder 102 of DSP block 200-4) is used to add this sum of four multiplies to the sum of four multiplies from another set of four DSP blocks beginning with DSP block 200-5 (remainder not shown as mentioned above). For N multipliers there will be N adders, which is sufficient to implement the adder tree of a dot product, which, for a pair of vectors of length N, is the sum of N multiplication operations.

Figure 5:
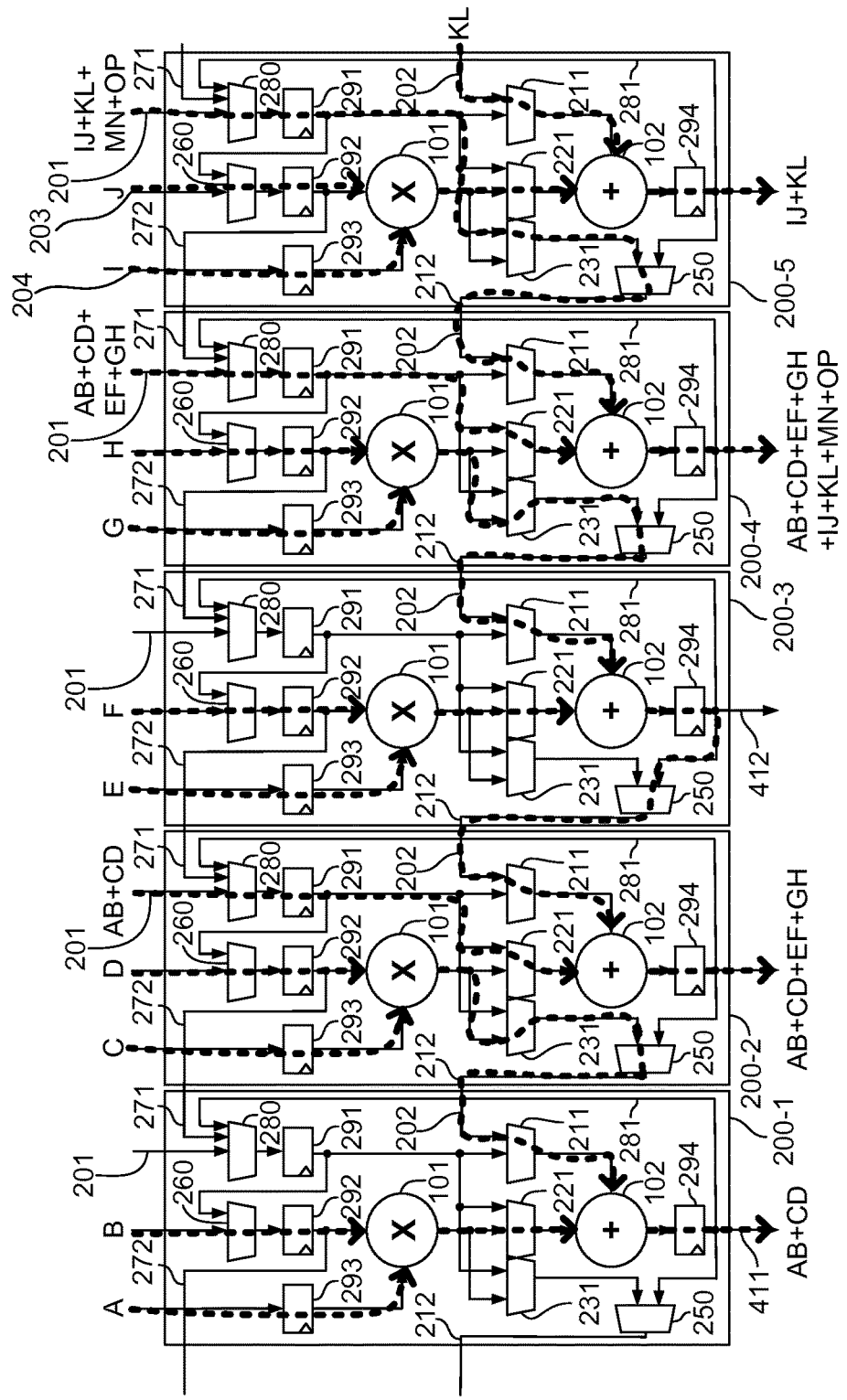
FIG. 5 shows an exemplary selection of data paths including a connection from the output of the adder stage to the adjacent specialized processing block when the arrangement of exemplary specialized processing blocks of FIG. 4 is used to implement a vector dot product operation in accordance with an embodiment of the present invention.

FIG. 5 shows using dotted lines an exemplary selection of data paths by multiplexers 211, 221, 231, 250, 260, 280 for the dot product application example described earlier in connection with FIG. 4, showing how adder 102 of each block 200-1-200-5 adds a product of the multiplier 101 in that block and a product from an adjacent block. For the illustrated method of adder tree implementation, some DSP block output is fed back to the input of another DSP block which may require external interconnect resources. Configuring the interconnect of DSP block 200-3 such that the output of the adder stage 102 is routed through multiplexer 250 to output 212 and from there to the adjacent DSP block 200-2 saves external interconnect resources. The interconnect of DSP block 200-3 may have been configured differently while still providing the sum EF+GH on output 212. For example, EF+GH may have been routed to multiplexer 280 of DSP block 200-3 and from there through multiplexers 231 and 250 to output 212. This configuration, which is sometimes also referred to as feedback connection vector mode, is illustrated with dotted lines in FIG. 6.

Certain embodiments of DSP block 200 (e.g., DSP blocks 200-1-200-5 in FIG. 5 and FIG. 6) may omit some of the multiplexers depending on the preferred arithmetic function. For example, an embodiment of DSP block 200 that preferably implements the dot product application example shown in FIG. 5 may omit multiplexers 211, 260, and 280, as well as related interconnect resources. In this configuration, input 201 may be connected directly (i.e., without traversing a multiplexer) to register 291, input 202 to adder stage 102, and input 203 to register 292. Register 291 may only connect to multiplexers 221 and 231, register 294 may only connect to multiplexer 250, and input 271 may be removed.

Figure 6:
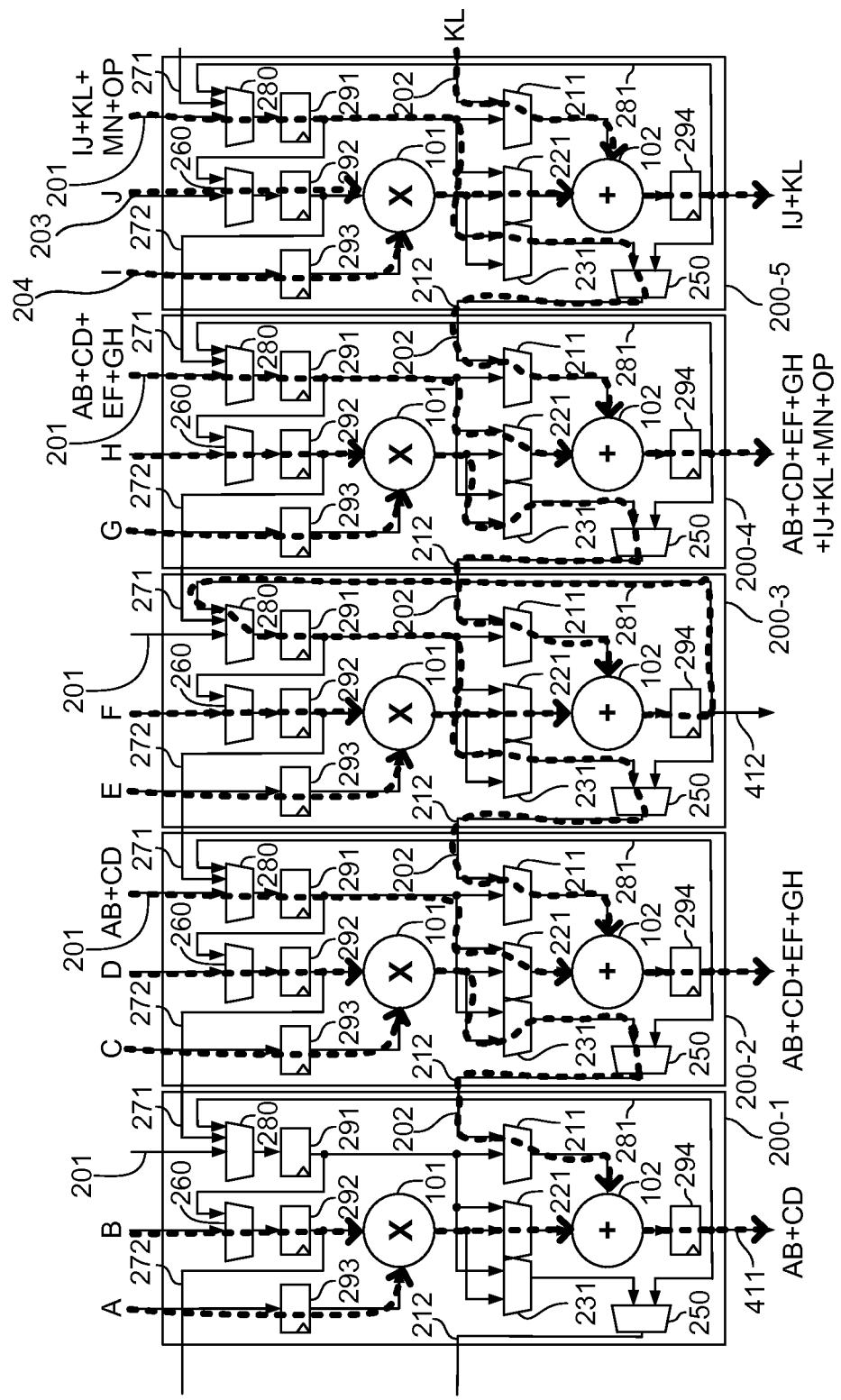
FIG. 6 shows an exemplary selection of data paths including a feedback path when the arrangement of exemplary specialized processing blocks of FIG. 4 is used to implement a vector dot product operation in accordance with an embodiment of the present invention.

Similarly, an embodiment of DSP block 200 that preferably implements the feedback connection vector mode shown in FIG. 6 may omit multiplexers 211, 250, and 260, as well as related interconnect resources. In this configuration, input 203 may connect directly (i.e., without traversing a multiplexer) to register 292, input 202 to adder stage 102, and multiplexer 231 to output 212. Register 291 may only connect to multiplexers 221 and 231, register 294 may only connect to multiplexer 280, and input 271 may be removed.

The same DSP block features used for the vector dot product may be used to implement a complex dot product.

Each second pair of DSP blocks would use a subtraction rather than an addition in the first level addition, which can be supported by the adder stage (e.g., by negating one of the inputs, in a straightforward manner). The rest of the adder tree is a straightforward sum construction, similar to that described in the preceding paragraph.

Consider the two vectors V and W where each element of V and W may be a complex number. For example, V=(A, E, I, M)+i(C, G, K, O)=(A+iC, E+iG, I+iK, M+iO) and W=(B, F, J, N)+i (D, H, L, P)=(B+iD, F+iH, J+iL, N+iP). The complex dot product of V and W may be computed by separately computing the real portion and the imaginary portion of the complex dot product. In this scenario, the real portion of the dot product of V and W is re(V*W)=AB−CD+EF−GH+IJ−KL+MN−OP. The DSP blocks of FIG. 6 may implement the real portion of the complex dot product of V and W using a similar configuration as for the vector dot product with the difference, that the adder stages in each second DSP block (e.g., 200-1, 200-3, 200-5, etc.) implements a substraction.

Now consider the two complex vectors V and Z with V as above and Z=(D, H, L, P)+i(B, F, J, N)=(D+iB, H+iF, L+iJ, P+iN). In this scenario, the imaginary portion of the dot product of V and Z is im(V*Z)=AB+CD+EF+GH+IJ+KL+MN+OP. The DSP blocks of FIG. 6 may implement the imaginary portion of the complex dot product of V and Z using the exact same configuration as for the vector dot product.

As discussed above, IEEE754-compliant rounding can be provided inside embodiments of the DSP block, or can be implemented using resources outside of the DSP block. For example, if the DSP block is integrated in a programmable logic device (PLD), rounding may be implemented using the general-purpose programmable logic portion of the device. The rounding may be implemented with a single level of logic, which may be as simple as a carry-propagate adder, followed by a register. Assuming, as is frequently the case, that all of the outputs of the DSP blocks must be rounded, there would be no disturbance or rebalancing of the data path required.

Another feature that may be implemented in DSP block 200 is the calculation of an overflow condition of the rounded value, which may be determined using substantially fewer resources than the addition. Additional features could calculate the value of a final exponent, or special or error conditions based on the overflow condition.

Figure 7:
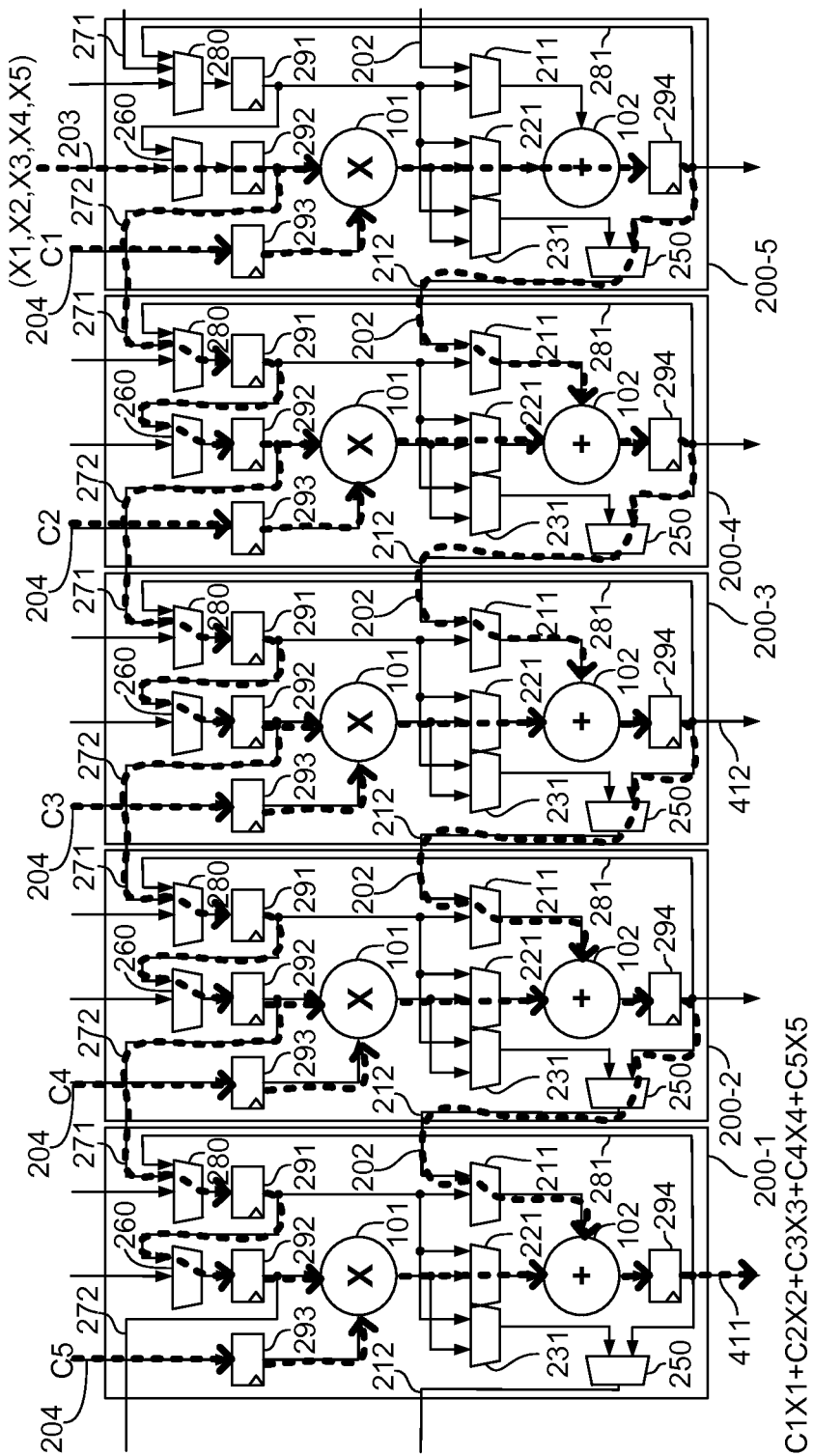
FIG. 7 is a diagram of an illustrative arrangement of exemplary specialized processing blocks showing an exemplary selection of data paths to implement a systolic FIR filter in accordance with an embodiment of the present invention.

The output of a FIR filter may be determined by a convolution of its input signal with its impulse response. In a time discrete FIR filter, the input signal is represented by an array of data samples. Each element of the array (i.e., the different data samples) are sometimes also referred to as "taps" of the FIR filter. The output signal of a time discrete FIR filter may be determined by computing the sum of the array of data samples multiplied with an array of coefficients. A systolic FIR filter is a FIR filter, in which the components of the array of data samples are shifted through the FIR filter taps together with the accumulated sum of the current and prior taps. FIG. 7 shows a row of five exemplary DSP blocks 200-1 to 200-5 according to an embodiment of the invention configured to implement a systolic FIR filter. The illustrated example shows a fourth order, five tap systolic FIR filter with coefficients C1, C2, C3, C4, and C5 and input signal X having components X1, X2, X3, X4, and X5. An exemplary selection of data paths by multiplexers 211, 221, 250, 260, 280 is shown with dotted lines.

The coefficients may be provided to DSP blocks 200-1 to 200-5 at inputs 204 and stored in corresponding registers 293. Alternatively, internal coefficient register storage initialized during configuration (not shown) may be provided inside embodiments of the DSP block 200 for the purpose of storing constant values such as FIR filter coefficients.

DSP block 200-5 may receive input signal X at input 203 and route the input signal to multiplier stage 101 and to output 272. DSP blocks 200-1 to 200-4 may receive input signal X at input 271 from output 272 of the adjacent DSP block. Multiplexers 260 and 280 in DSP blocks 200-1 to 200-4 may be configured to route the input signal from input 271 to register 291, from there to register 292, and from there to the multiplier stage and output 272. Thus, input signal X is shifted into DSP block 200-5 and from there into each subsequent DSP block 200-4 to 200-1. Registers 291 and 292 may implement the delays in the input signals between multiplications with coefficients.

The first stage, implemented in DSP block 200-5, may bypass the adder stage 102 and route the product C1*X1 directly to register 294. Alternatively, the product may be routed to the adder stage and have a zero added to the product before the sum is stored in register 294.

Since the input signal X is shifted into DSP block 200-5 and from there into each subsequent DSP block 200-4 to 200-1, there must be a corresponding delay between additions to maintain synchronization between the input signals and the accumulated sum computed in adder stages 102. Register 294 may be used to implement the delay between additions. For DSP blocks 200-2 to 200-5, the output of register 294 may be routed through multiplexer 250 to output 212. This signal may be received at input 202 in the adjacent DSP blocks 200-1 to 200-4 from where the signal may be routed through multiplexer 211 to the adder stage.

In DSP blocks 200-1 to 200-4, the product of input signal X and coefficients is routed to the adder stage and added to the result of the previous tap received at input 202. For example, in DSP block 200-4, the product C2*X2 computed in multiplier 101 of DSP block 200-4 is added by adder stage 102 of DSP block 200-4 to the product C1*X1 received at input 202 from DSP block 200-5. Similarly, in DSP block 200-3, the product C3*X3 computed in multiplier 101 of DSP block 200-3 is added by adder stage 102 of DSP block 200-3 to C1*X1+C2*X2 received at input 202 from DSP block 200-4. Thus, the final result, which is C1*X1+C2*X2+C3*X3+C4*X4+C5*X5 may be obtained at output 411 of DSP block 200-1.

In an alternative implementation, input signal X may be received at inputs 203 of DSP blocks 200-1 to 200-5. In this configuration, the row of DSP blocks may implement a direct form FIR filter by bypassing registers 294 (no delay element between adders) and delaying input signal X only once by using register 292.

Embodiments of DSP block 200 may include additional adders (not shown). These adders may receive input signals and produce the sum of those input signals. Multiplying the coefficients with the sum of the input signals enables support for symmetric direct-form FIR filters.

Figure 8:
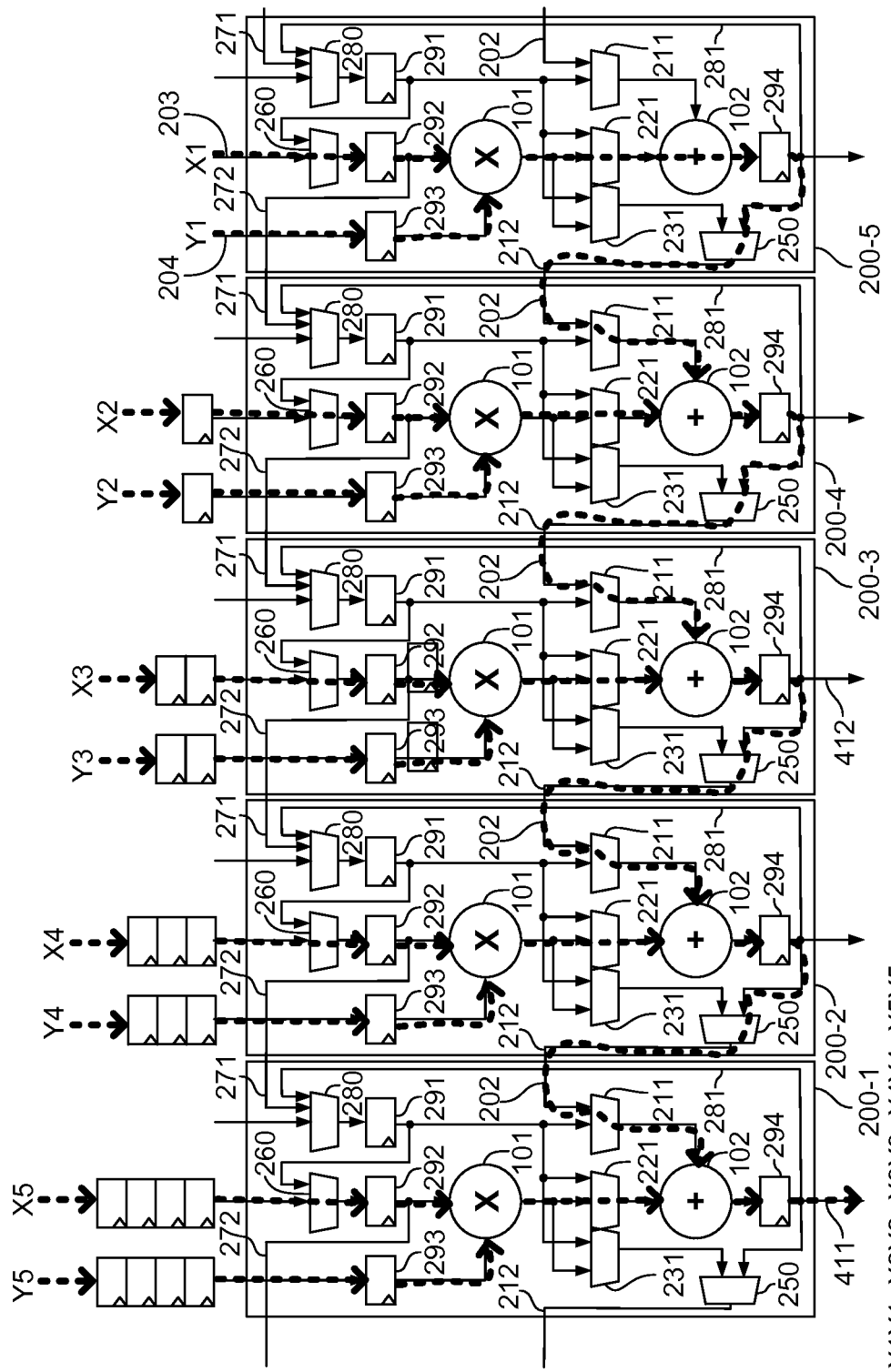
FIG. 8 is a diagram of an illustrative arrangement of exemplary specialized processing blocks showing an exemplary selection of data paths to implement a sequentially added vector dot product in accordance with an embodiment of the present invention.

FIG. 8 shows a row of five exemplary DSP blocks 200-1 to 200-5 according to an embodiment of the invention configured to perform a sequentially added dot product operation. The illustrated example shows two vectors X=(X1, X2, X3, X4, X5) and Y=(Y1, Y2, Y3, Y4, Y5) that are multiplied element by element in multiplier stage 101 of DSP blocks 200-1 to 200-5. Each product is added to a previous cumulative result produced in an adjacent DSP block to the right. The result from the adjacent DSP block to the right is routed from register 294 of the adjacent DSP block through multiplexer 250, output 212, to input 202 and from there through multiplexer 211 to the adder stage. The operation is pipelined by storing signals in registers 292, 293, and 294. Since intermediate results from adjacent DSP blocks to the right are delayed by one pipelining step, an additional pipelining stage is required for every DSP block left of the rightmost DSP block 200-5 (i.e. DSP block 200-4 needs one pipeline stage, DSP block 200-3 needs two, 200-3 needs three, and 200-1 needs four pipelining stages). In one embodiment, these pipelining stages may be implemented using resources external to the DSP blocks.

An exemplary selection of data paths by multiplexers 211, 221, 250, 260 is shown with dotted lines in FIG. 8. The implementation of the sequentially added dot product operation presented above allows computing a new dot product every clock cycle.

Figure 9:
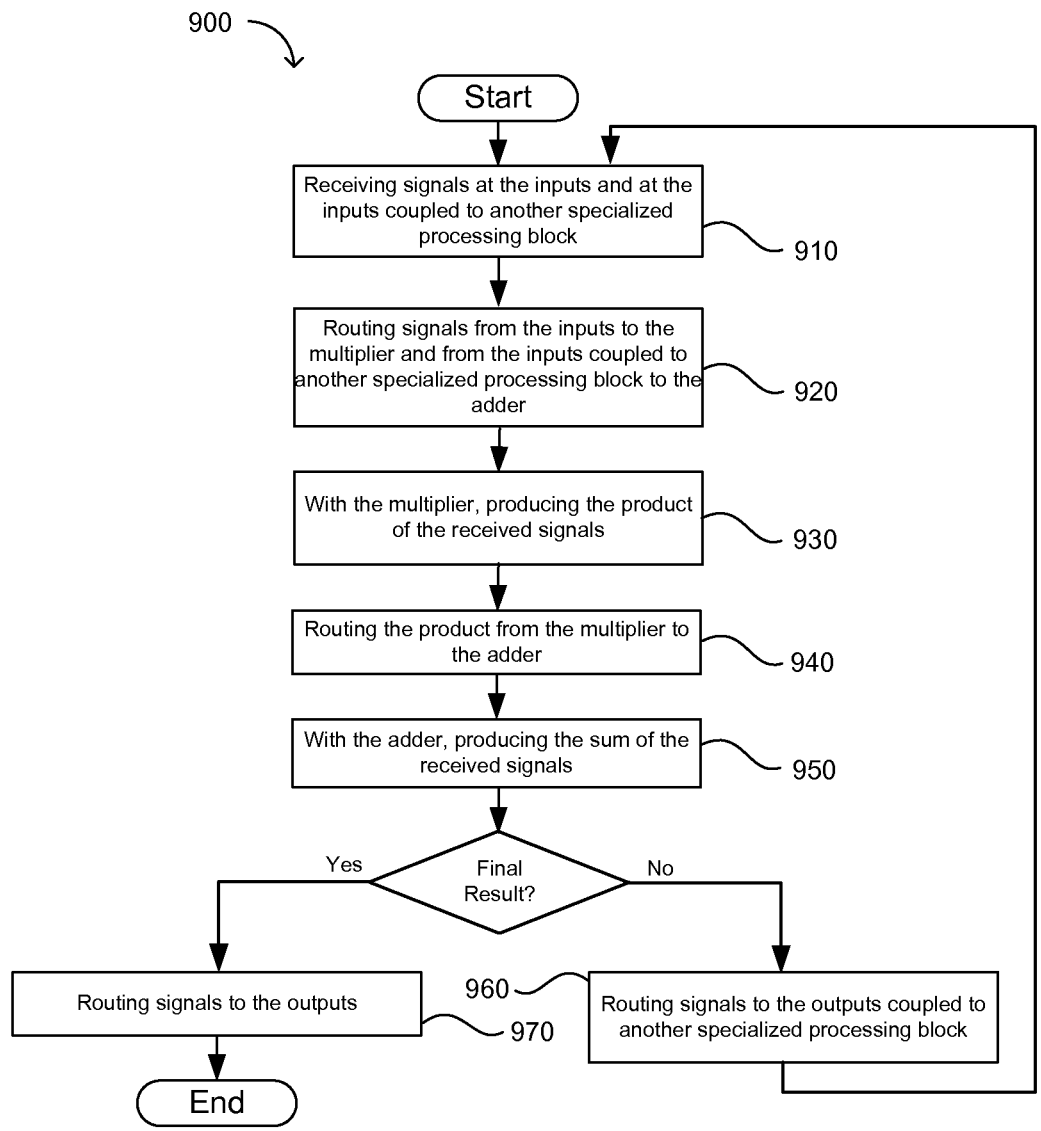
FIG. 9 is a flow chart of illustrative steps for performing a sequentially added vector dot product operation in accordance with an embodiment of the present invention.

FIG. 9 shows a flow chart explaining different steps that may be executed with a DSP block to implement a sequentially added dot product. During step 910, intermediate results computed in adjacent DSP blocks to the right in FIG. 8 are received at inputs 202. During step 920, the intermediate results are routed from input 202 to the adder, and signals received at inputs 203 and 204 are routed to registers 292 and 293 and from there to the multiplier. During step 930, the product of the received signals may be produced in the multiplier. During step 940, the product is routed to the adder, and during step 950, the product is added to the intermediate results received at input 202. The sum is then stored in register 294. During step 970, the output of register 294 is routed to output 411 if the sum constitutes the final result.

If the sum does not constitute the final result, then the interconnect may be configured to route the output of register 294 through multiplexer 250 to output 212 and from there to input 202 of the adjacent DSP block to the left.

Figure 10:
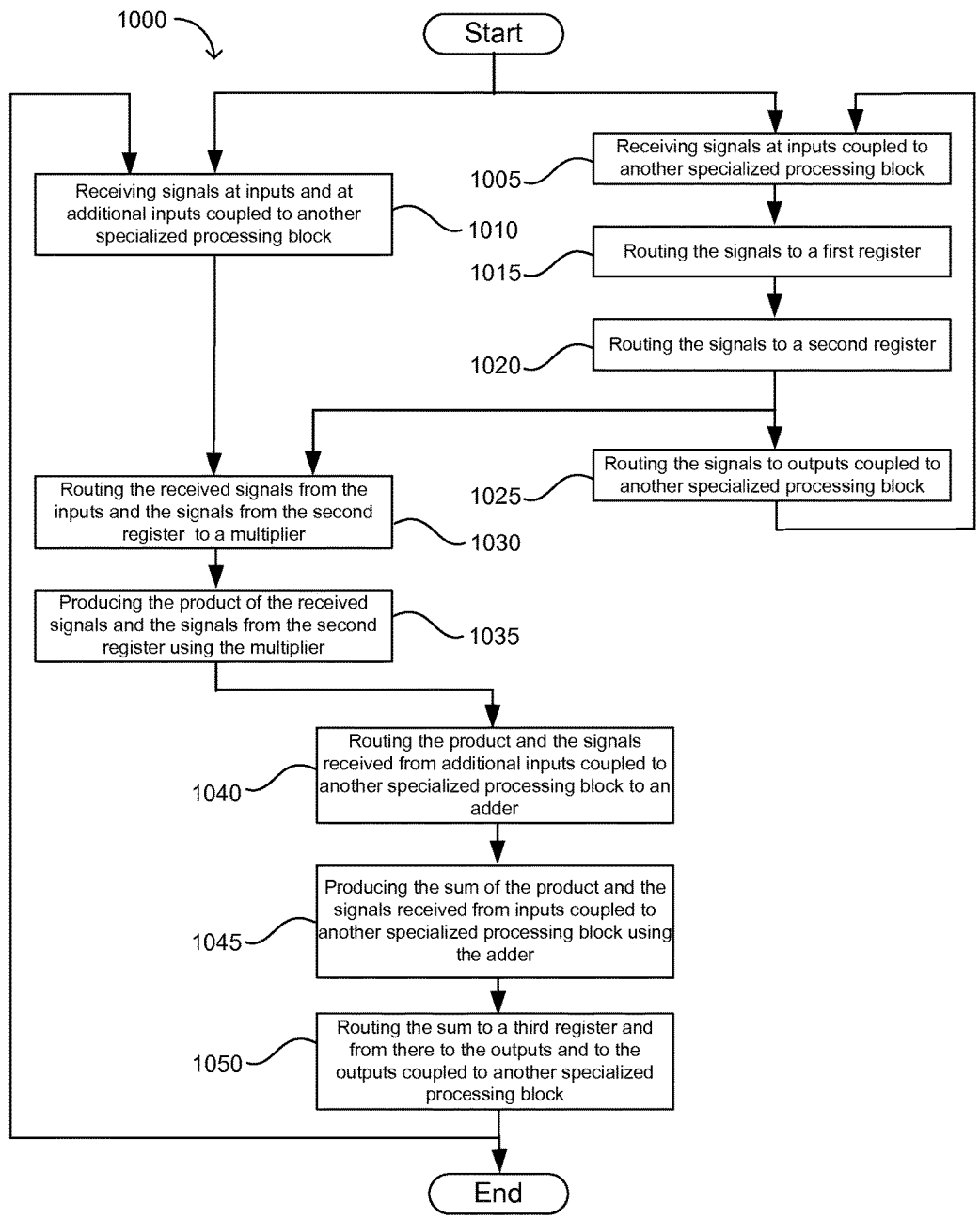
FIG. 10 is a flow chart of illustrative steps for operating a systolic FIR filter in accordance with an embodiment of the present invention.

FIG. 10 is a flow chart illustrating different steps that may be executed with a DSP block to implement a systolic FIR filter. During step 1005, input signal X from FIG. 7 is received at input 271 if the DSP block is not the rightmost DSP block 200-5. In this case, input signal X may be routed to a first register (e.g. register 291 in FIG. 7) during step 1015 and from there to a second register (e.g. register 292 in FIG. 7) during step 1020.

If the DSP block is the rightmost DSP block in FIG. 7, then during step 1010, input signal X may be received at input 203. During step 1010, coefficients may be received (e.g. at input 204) and intermediate results produced by adjacent DSP blocks to the right may be received at input 202. During step 1030, coefficients received at input 204, and input signal X received at input 203 in case of the rightmost DSP block or input signal stored in register 292 in all other cases may be routed to multiplier 101. The input signal stored in register 292 may also be routed to output 272 and from there to input 271 of the adjacent DSP block to the left as shown in step 1025.

During step 1035, the product of the signals at the input of multiplier 101 may be produced. The product may be routed together with the intermediate results received on input 202 to adder 102 as shown in step 1040. During step 1045, the adder may produce the sum of the product and the intermediate results received on input 202. During step 1050, the sum may be stored in register 294 and from there routed to output 411 and through multiplexer 250 to output 212.

By providing specialized processing blocks, including dedicated, but configurable, fixed-point operators or floating-point operators, the present invention allows the implementation of certain operations, such as the vector dot product, the complex dot product, the systolic FIR filter, and the sequentially added vector, all described above, with less reliance on interconnect resources outside the blocks.

The method and apparatus described herein may be incorporated into any suitable integrated circuit (IC) or system of integrated circuits. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit, comprising:
   first and second specialized processing blocks, wherein the first specialized processing block comprises:
   a first arithmetic operator stage;
   a second arithmetic operator stage; and
   an output that is directly coupled to the second specialized processing block, wherein the first arithmetic operator stage has an output port that is coupled to the output of the first specialized processing block via a first path and that is coupled to an input port of the second arithmetic operator stage via a second path that is separate from the first path.

2. The integrated circuit defined in claim 1, wherein the first specialized processing block further comprises:
   an additional output, wherein the second arithmetic operator stage has an output port that is coupled to the additional output.

3. The integrated circuit defined in claim 1, wherein the first arithmetic operator stage generates a signal that is simultaneously routed to the output of the first specialized processing block via the first path and to the second arithmetic operator stage via the second path.

4. The integrated circuit defined in claim 1, wherein the first arithmetic operator stage comprises a multiplication stage.

5. The integrated circuit defined in claim 1, wherein the second arithmetic operator stage comprises an adder stage.

6. The integrated circuit defined in claim 2, wherein the first specialized processing block further comprises:
a multiplexer having a first multiplexer input that is coupled to the output port of the first arithmetic operator stage, a second multiplexer input that is coupled to the output port of the second arithmetic operator stage, and a multiplexer output that is coupled to the output of the first specialized processing block.

7. The integrated circuit defined in claim 6, wherein the multiplexer output is directly coupled to the output of the first specialized processing block.

8. A method of operating an integrated circuit that includes first and second specialized processing blocks, comprising:
with a first arithmetic operator stage in the first specialized processing block, generating an output signal;
routing the output signal to a second arithmetic operator stage in the first specialized processing block; and
bypassing the second arithmetic operator stage by routing the output signal to an output of the first specialized processing block that is directly coupled to the second specialized processing block.

9. The method defined in claim 8, wherein the first arithmetic operator stage comprises a multiplier stage, and wherein the second arithmetic operator stage comprises an adder stage.

10. The method defined in claim 8, wherein the output signal is simultaneously routed to the second arithmetic operator stage and to the output of the first specialized processing block.

11. The method defined in claim 8, further comprising:
with a multiplexer in the first specialized processing block, receiving the output signal from the first arithmetic operator stage and receiving another output signal from the second arithmetic operator stage.

12. The method defined in claim 11, further comprising:
with the multiplexer, routing a selected one of the output signal received from the first arithmetic operator stage and the another output signal received from the second arithmetic operator stage to the output of the first specialized processing block.

13. The method defined in claim 8, wherein the integrated circuit further includes a third specialized processing block, the method further comprising:
with a multiplexer in the first specialized processing block, receiving another output signal from the third specialized processing block and routing the another output signal to the second arithmetic operator stage.

14. The method defined in claim 13, further comprising:
with the second arithmetic operator stage, receiving the output signal from the first arithmetic operator stage, receiving the another output signal from the multiplexer, and producing a corresponding signal to an additional output of the first specialized processing block.

15. A method of operating a first specialized processing block on an integrated circuit, wherein the first specialized processing block is coupled to second and third specialized processing blocks on the integrated circuit, the method comprising:
using a first arithmetic operator stage in the first specialized processing block to generate an output signal;
routing the output signal to an output of the first specialized processing block that is directly coupled to the second processing block via a first path; and
routing the output signal to a second arithmetic operator stage in the first specialized processing block via a second path that is separate from the first path.

16. The method defined in claim 15, further comprising:
receiving an input signal from the third specialized processing block at the second arithmetic operator stage.

17. The method defined in claim 16, wherein the third specialized processing block is directly coupled to the first specialized processing block.

18. The method defined in claim 17, further comprising:
with a multiplexer in the first specialized processing block, receiving the input signal from the third specialized processing block, receiving an additional input signal from a fourth specialized processing block in the integrated circuit, and outputting a selected one of the input signal and the additional input signal to the second arithmetic operator stage.

19. The method defined in claim 15, wherein the output signal is routed to the second arithmetic operator stage and to the output of the first specialized processing block in parallel.

20. The method defined in claim 15, further comprising:
receiving the output signal from the first arithmetic operator stage and another output signal from the second arithmetic operator stage at a multiplexer in the first specialized processing block.

* * * * *